United States Patent

Watanabe et al.

[11] Patent Number: 5,851,702
[45] Date of Patent: Dec. 22, 1998

[54] METHOD FOR PRODUCING A PHOTOMASK

[75] Inventors: Kunio Watanabe, Tenri; Shinji Kobayashi, Nara; Masashi Inoue, Sakai, all of Japan

[73] Assignee: Sharp Kabushiki Kaisha, Osaka, Japan

[21] Appl. No.: 871,977

[22] Filed: Jun. 10, 1997

[30] Foreign Application Priority Data

Aug. 28, 1996 [JP] Japan .................................. 8-226382

[51] Int. Cl.$^6$ ...................................................... G03F 9/00
[52] U.S. Cl. ................................................ 430/5; 430/296
[58] Field of Search ................................ 430/5, 296, 322

[56] References Cited

U.S. PATENT DOCUMENTS 5,658,826   8/1997   Chung ...................................... 438/570

FOREIGN PATENT DOCUMENTS 5-175094   7/1993   Japan .

OTHER PUBLICATIONS

"Mask Fabrication," D.J. Elliott, Integrated Circuit Fabrication Technology, 2$^{nd}$ Ed., McGraw Hill, 1989.

Primary Examiner—S. Rosasco
Attorney, Agent, or Firm—Nixon & Vanderhye

[57] ABSTRACT

A method for producing a photomask of the present invention includes the steps of: forming a light-blocking film on a surface of a transparent substrate; forming a resist film for an EB on the light-blocking film; patterning the resist film by EB writing and development; and selectively etching the light-blocking film using the patterned resist film to form a photomask, wherein the light-blocking film has a thickness in the range of about 60 nm to about 70 nm.

7 Claims, 8 Drawing Sheets

PRIOR ART

METHOD FOR PRODUCING A PHOTOMASK

BACKGROUND OF THE INVENTION

1. Field of the Invention

The present invention relates to a method for producing a photomask.

2. Description of the Related Art

A conventional blank mask used for producing a photomask has a two-layer structure including a transparent substrate and a light-blocking film formed on the surface of the transparent substrate. Quartz is mainly used as a material for the transparent substrate and chromium is mainly used as a material for the light-blocking film. The light-blocking film is generally formed by vacuum deposition or sputtering so as to have a thickness of about 110 nm.

Next, a method for forming a photomask will be described.

A resist film for an electron beam (hereinafter, referred to as an "EB") is used as a protective film in the course of production of a photomask from a blank mask. The resist film is coated onto a light-blocking film (made of chromium) by a spin-on method so as to have a thickness of about 500 nm, and patterned by EB writing and development.

The light-blocking film is patterned by wet etching, using the resist film as a mask. Wet etching is classified into a soaking method and a spray method. It is desirable that the ratio in thickness between the resist film and the light-blocking film is 3:1.

In the case where wet etching is used for producing a photomask, an undercut of 0.1 µm or more is caused by side etching according to both of the above-mentioned methods. As a result, the size of the patterned light-blocking film becomes smaller than that of the patterned resist film. FIG. 8 is a cross-sectional view showing an undercut phenomenon. This figure shows the configuration of a chromium film 20 formed on a transparent substrate 1, which has been subjected to wet etching, using a resist film 30 as a mask. As shown in FIG. 8, an etchant comes in below the resist film 30 from the edges of a window portion 31 of the resist film 30 to etch the chromium film 20 in the lateral direction.

When the pattern size of the chromium film 20 becomes as small as 1 µm, the size precision of a photomask to be obtained degrades due to the above-mentioned undercut. FIG. 9A shows an optical proximity correction (OPC) mask pattern obtained by the above-mentioned conventional method. As shown in this figure, each corner of the pattern is round. FIG. 9B shows a designed OPC mask pattern 4.

According to lithography using an i-line and a g-line, the minimum pattern size of a chromium film is about 2 µm. Therefore, even when the chromium film is subjected to wet etching, a photomask with a precision capable of realizing a desired pattern size can be obtained. However, according to lithography using a KrF excimer laser, the minimum pattern size of a chromium film is about 1 µm. Therefore, a sufficient size precision of a photomask cannot be obtained.

In order to miniaturize a light exposure pattern (mainly, a chromium film pattern), techniques of a dry etching method such as plasma etching and sputtering are proposed. The dry etching method limits the undercut to 0.05 µm or smaller and allows a pattern to be formed in accordance with a resist mask. Thus, the dry etching is superior to the wet etching method.

However, a resist film for an EB has poor resistance to dry etching, so that a thickness of the resist film greatly decreases in a great amount. In particular, the resolution of the resist film is too low to pattern a chromium film in accordance with a resist mask. These two points influence patterning of a chromium film and prevents a size precision of a photomask required for KrF excimer lithography from being obtained, even when the chromium film is patterned.

SUMMARY OF THE INVENTION

A method for producing a photomask according to the present invention includes the steps of: forming a light-blocking film on a surface of a transparent substrate; forming a resist film for an EB on the light-blocking film; patterning the resist film by EB writing and development; and selectively etching the light-blocking film using the patterned resist film as a mask to form a photomask, wherein the light-blocking film has a thickness in the range of about 60 nm to about 70 nm.

In one embodiment of the present invention, the resist film has a thickness in the range of about 280 nm to about 350 nm.

In another embodiment of the present invention, the light-blocking film contains chromium.

In another embodiment of the present invention, an exposure amount of an EB used in the EB writing is in the range of about 2.3 $\mu C/cm^2$ to about 2.6 $\mu C/cm^2$.

In another embodiment of the present invention, the step of selectively etching the light-blocking film is performed by dry etching.

Thus, the invention described herein makes possible the advantage of providing a method for producing a photomask capable of improving the size precision of a photomask.

This and other advantages of the present invention will become apparent to those skilled in the art upon reading and understanding the following detailed description with reference to the accompanying figures.

DESCRIPTION OF THE PREFERRED EMBODIMENTS

Hereinafter, a method for producing a photomask according to the present invention will be described by way of an illustrative embodiment with reference to the drawings. More specifically, a method for producing a photomask will be described, which includes the steps of patterning a resist film on a light-blocking film formed on the surface of a substrate; and etching the light-blocking film using the patterned resist film as a mask to form a photomask.

Figure 1:
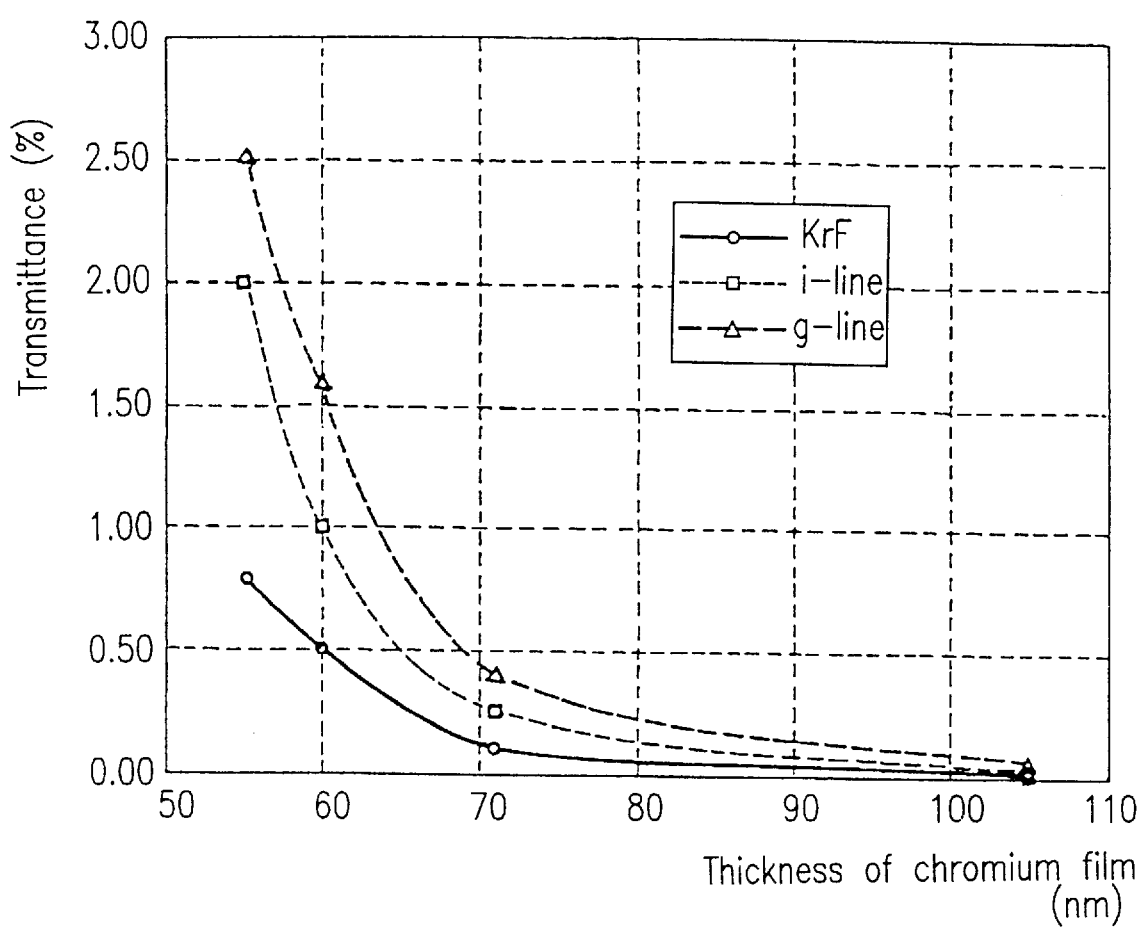
FIG. 1 is a graph showing a correlation between the thickness of a chromium film and the transmittance at each light exposure wavelength.

According to the present invention, the decrease in thickness of the resist film caused by dry etching is minimized by making a light-blocking film as thin as possible so as to shorten a dry etching time. FIG. 1 shows a relationship between the thickness of a chromium film as a light-blocking film and the transmittance at each light exposure wavelength of a KrF excimer laser, i-line and g-line.

As shown in FIG. 1, the thickness of a chromium film which can be used becomes smallest in the case of using a KrF excimer laser for EB writing at constant transmittance. That is, the use of a beam with a shorter wavelength allows the thickness of a chromium film which can be used to be smaller. In the case where the transmittance which is a required property of the light-blocking film is set to be 0.5% or lower (which does not cause rapid optical changes), and a KrF excimer laser is used, a thin chromium film having a thickness of about 60 nm can be used.

Figure 9A:
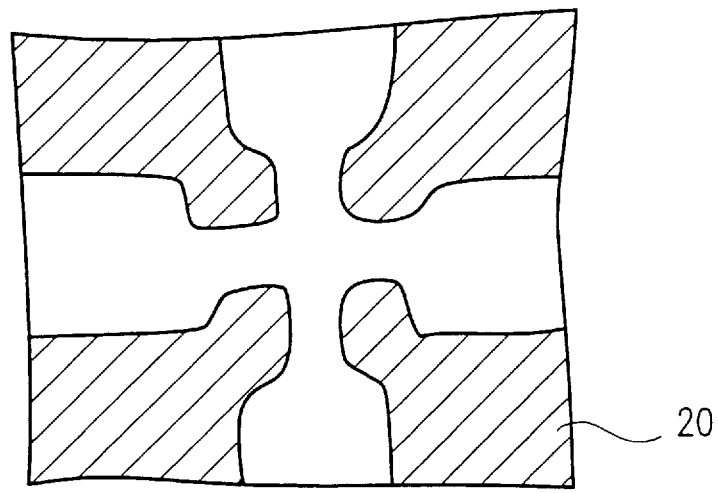
FIG. 9A shows a mask pattern formed by a conventional method.
Figure 9B:
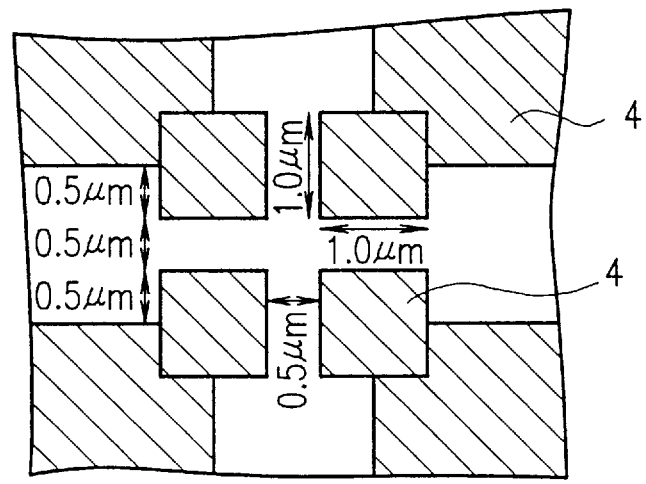
FIG. 9B shows a designed mask pattern.

According to the present invention, a photomask having a desired configuration can be formed by using a light-blocking film with a thickness of about 60 nm to about 70 nm. When a light-blocking film with a thickness of 70 nm or more is used, each corner of a mask pattern becomes round as shown in FIG. 9A.

When a resist film for patterning a light-blocking film is made thinner, a pattern of the resist film can be easily obtained with high precision. Therefore, it is required to make the resist film as thin as possible.

Figure 2:
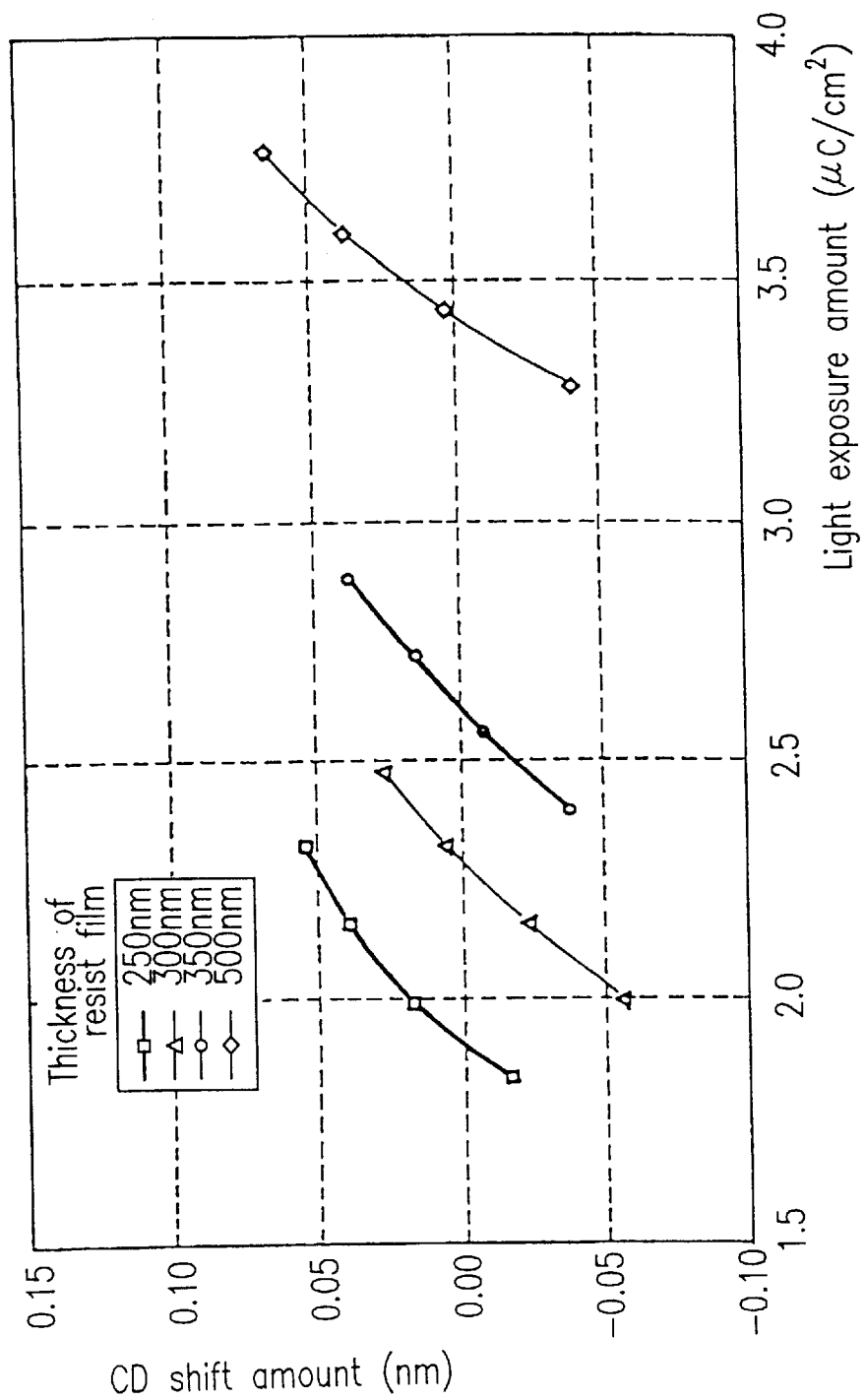
FIG. 2 is a graph showing characteristics of a light exposure amount and a critical dimension (CD) shift amount with varying thickness of a resist film.
Figure 3:
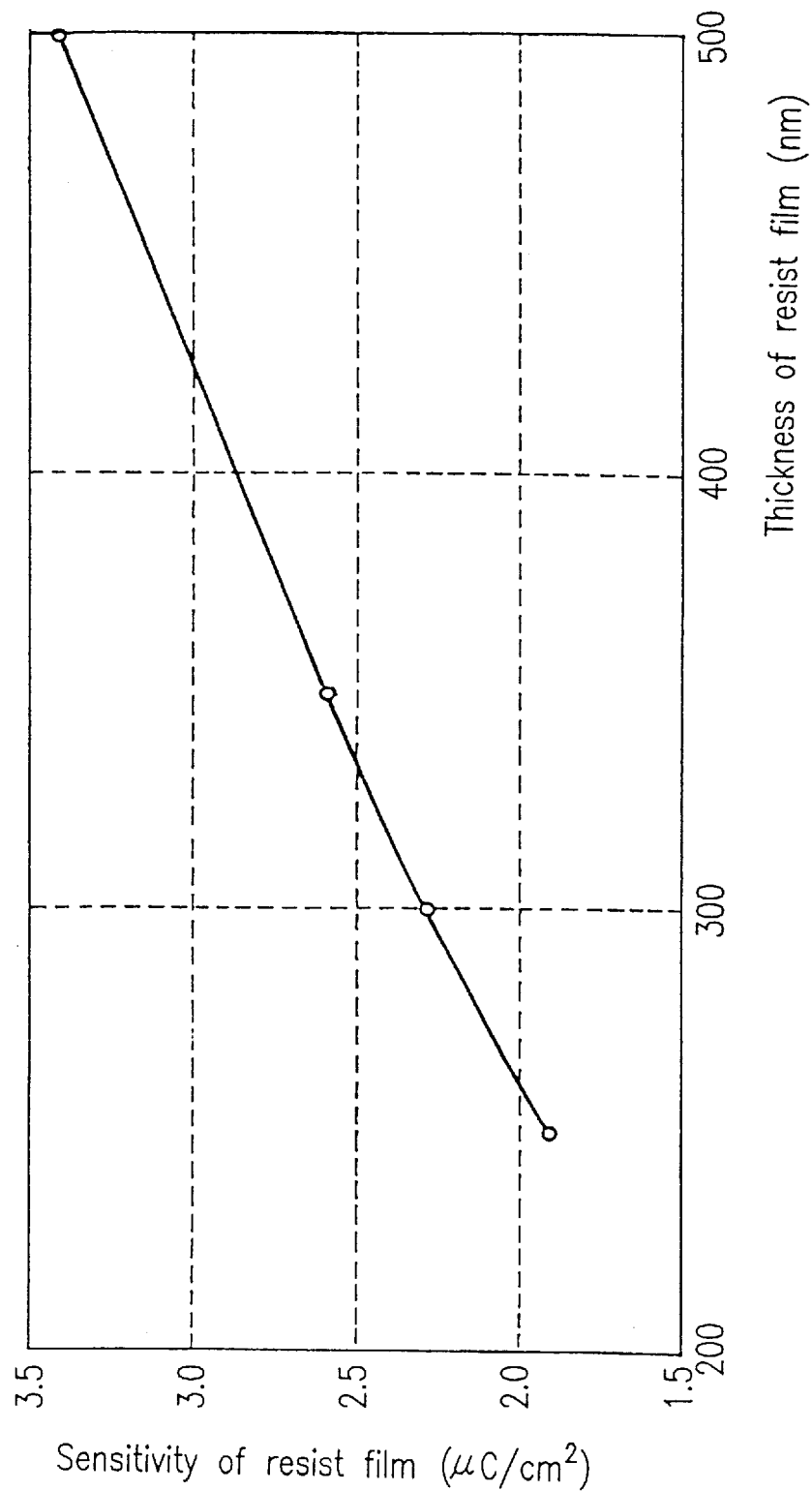
FIG. 3 is a graph showing a relationship between the sensitivity and the thickness of a resist film in which EB exposure amounts at a CD shift amount of zero in FIG. 2 are plotted.

FIG. 2 is a graph showing a relationship between the thickness of a resist film, the light exposure amount, and the critical dimension (CD) shift amount of line width (i.e., shift of measured data from designed data). FIG. 3 is a graph showing a relationship between the resist sensitivity and the thickness of a resist film, wherein the EB exposure amount at a CD shift amount of zero in FIG. 2 is defined as the resist sensitivity (practical sensitivity). As shown in FIG. 3, there is an almost linear relationship between the resist sensitivity and the thickness of a resist film.

Figure 4:
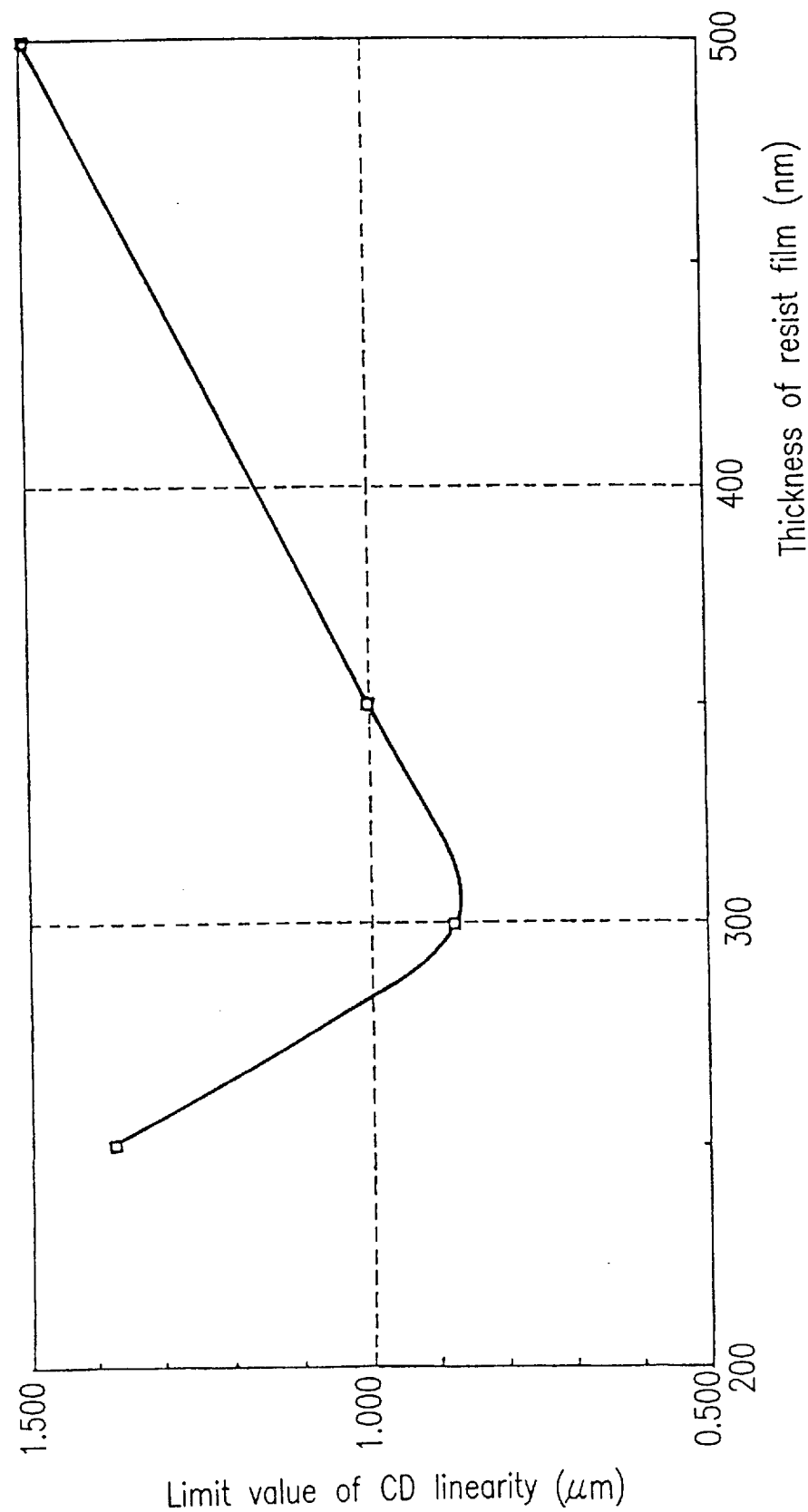
FIG. 4 is a correlation between the thickness of a resist film and the limit value of CD linearity.

FIG. 4 is a graph showing a relationship between the thickness of a resist film and the limit value of CD linearity. The limit value of CD linearity is desirably set to be 1.000 $\mu$m or less. As shown in FIG. 4, the optimum thickness of a resist film is in the range of about 280 nm to about 350 nm where the limit value of CD linearity becomes 1.000 $\mu$m or less. It is more effective that a resist film for an EB is used in this case.

The optimum value of the EB exposure amount with the optimum thickness of a resist film in the range of about 280 nm to about 350 nm becomes about 2.3 $\mu C/cm^2$ to about 2.6 $\mu C/cm^2$ as shown in FIG. 2. In order to form a minute pattern, it is required to correct the degradation of the CD linearity (resolution margin) by increasing the EB exposure amount. A thin resist film has high sensitivity, so that the exposure amount is allowed to be increased sufficiently.

Figure 5:
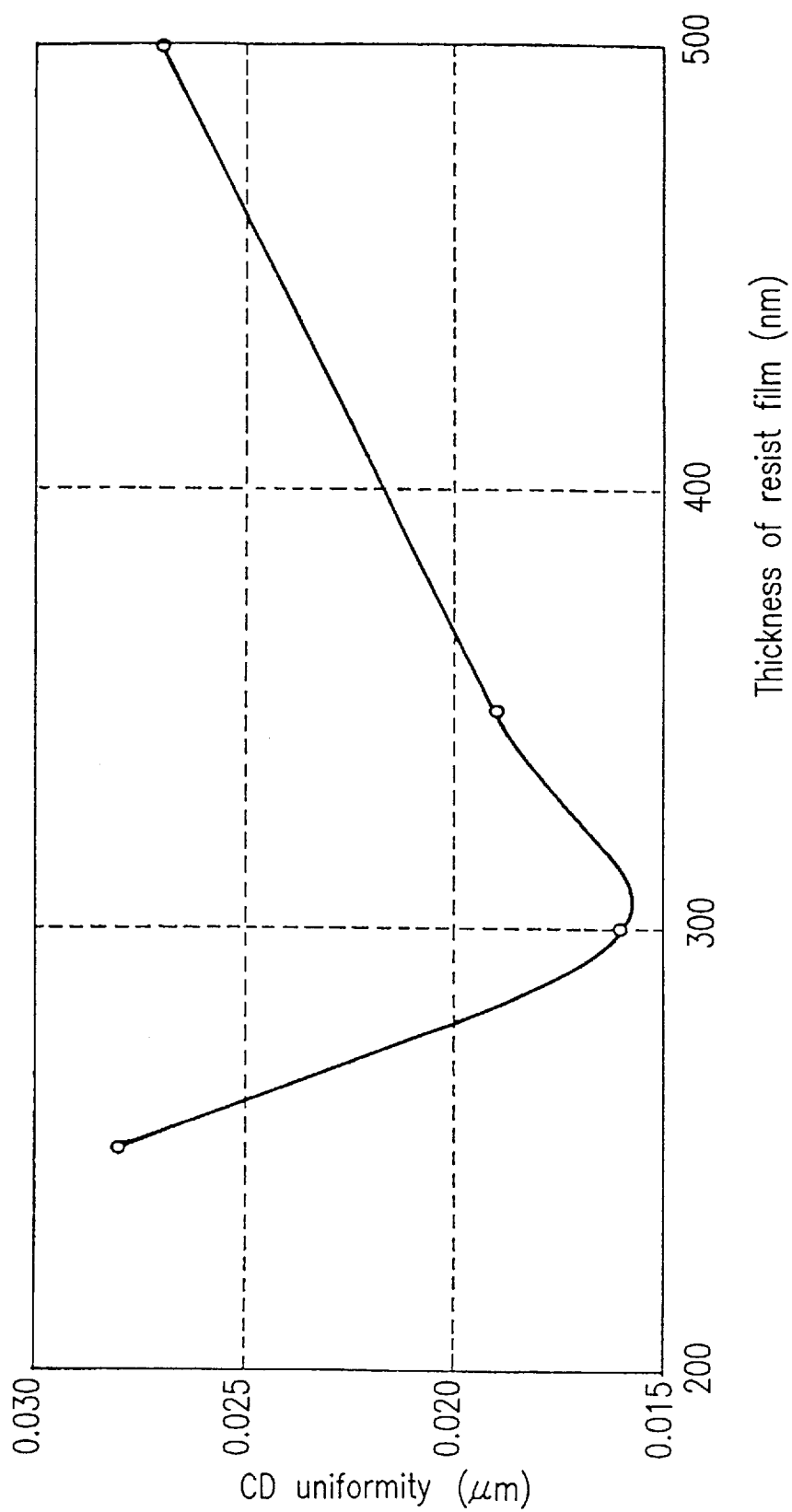
FIG. 5 is a graph showing a relationship between the thickness of a resist film and the CD uniformity.

FIG. 5 is a graph showing a relationship between the thickness of a resist film and the CD uniformity. As shown in FIG. 5, the CD uniformity exhibits the same behavior as that of the CD linearity. The CD uniformity can be set to be 0.020 $\mu$m or less in a resist film (thickness: about 280 nm to about 350 nm) pattern having a satisfactory pattern configuration with a large resolution margin.

When the thickness of a chromium film becomes smaller, tapering of the chromium film pattern can be minimized. The use of dry etching can minimize edge roughness.

Hereinafter, the steps of producing a photomask of an embodiment according to the present invention will be described with reference to FIGS. 6A through 6D.

Figure 6A:
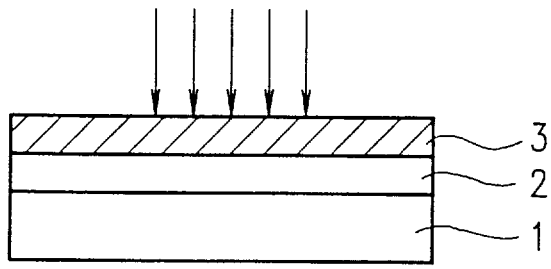
FIGS. 6A through 6D show the steps of producing a photomask of one embodiment according to the present invention.

First, referring to FIG. 6A, a chromium film 2 (thickness: about 60 nm) is formed on a transparent substrate 1 by sputtering, vacuum deposition, etc. Then, a resist film 3 for an EB (thickness: about 300 nm) is coated onto the chromium film 2. The resist film 3 should have outstanding etching resistance during etching of the chromium film 2. In the present embodiment, ZEP8100S produced by Nippon Zeon Co., Ltd. is used.

Figure 6B:
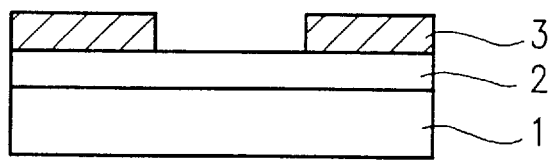

Next, an EB is written to the resist film 3. The charge amount of the EB is set in such a manner that the EB is not written in a light-blocking region of the resist film 3, and the light-passing region of the resist film 3 can be completely removed in the following step. The exposure amount is set to be about 2.3 (1.15×2) $\mu C/Cm^2$. A resist film can be a negative type or a positive type. A positive type resist film is used in this embodiment. A portion of the resist film 3 irradiated with the EB is dissolved in a developing solution, whereby the chromium film 2 is partially exposed (FIG. 6B).

After development, the exposed portion of the chromium film 2 is dry-etched. As a dry etching method, a parallel plate type reactive ion etching (RIE) method is used. A mixture of $CCl_4$ (tetrachloromethane) and $O_2$ (oxygen) or a mixture of $CH_2Cl_2$ (dichloromethane) and $O_2$ is used as an etching gas. The flow ratio between $CCl_4$ or $CH_2Cl_2$ and $O_2$ is set to be 25:75. RF power, pressure, and discharge frequency are respectively set to be 200 W (it should be 500 W or lower), 0.250 Torr (33.25 Pa), and 13.56 MHz.

Figure 6C:
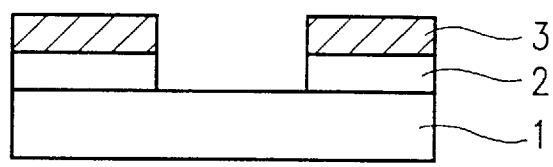

The etching selectivity ratio between chromium and quartz is 25 to 30 and the etching rate of chromium is 55 nm/min. under the above condition. Furthermore, the resist film 3 functions as a protective film for etching, and only a portion of the chromium film 2 not covered with the resist film 3 is removed, whereby the transparent substrate 1 is partially exposed (FIG. 6C). In the case where a chlorine type gas is used for dry etching of the chromium film 2, the resistance to dry etching of the resist film 3 is sufficient.

Figure 6D:
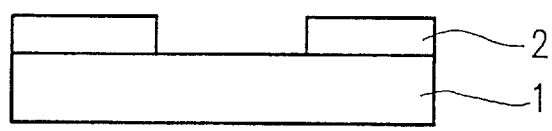

Next, after the chromium film 2 is partially etched, the remaining resist film 3 is completely removed (FIG. 6D). The resist film 3 is removed by being soaked in dimethylformamide, acetone, and a mixture of sulfuric acid and hydrogen peroxide in this order. In this case, the transparent substrate 1 and the chromium film 2 have sufficient resistance to these agents.

Figure 7:
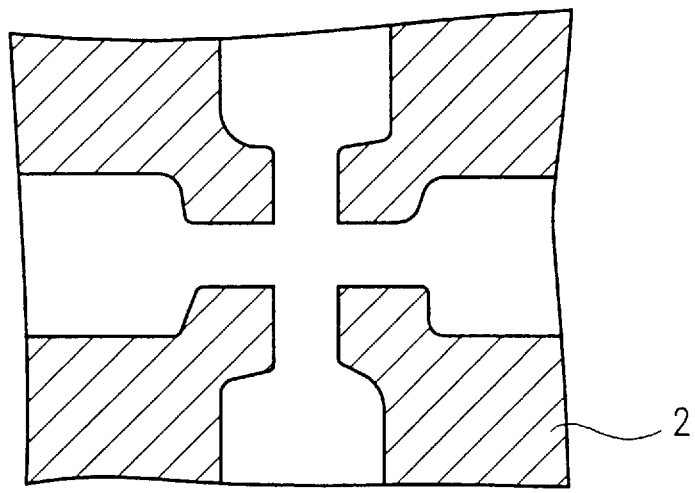
FIG. 7 shows a mask pattern formed by the method according to the present invention.
Figure 8:
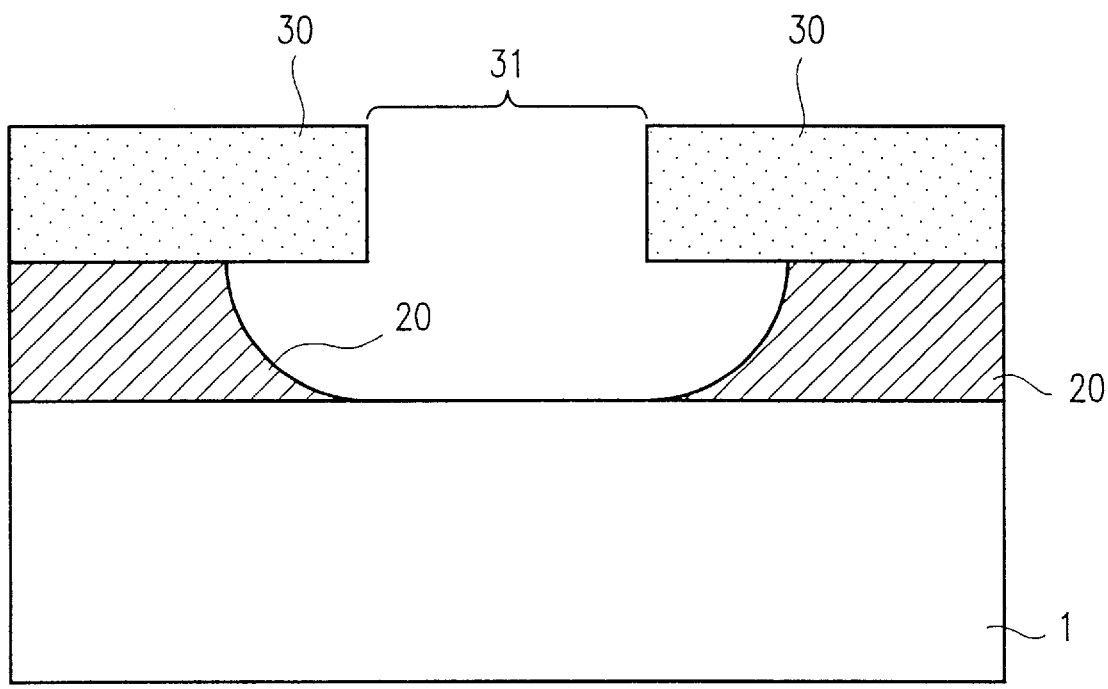
FIG. 8 is a cross-sectional view of a conventional mask pattern.

In the present embodiment, the chromium film 2 (thickness: about 60 nm) is patterned using the resist film 3 (thickness: about 300 nm). As a result, a satisfactory serif pattern (OPC mask pattern) configuration as shown in FIG. 7 is obtained. In the case where the resist film 3 has smaller thickness (e.g., 250 nm), it is insufficient during etching. This degrades a pattern configuration, resulting in a pattern with round corners. In this case, the CD linearity becomes unsatisfactory as shown in FIG. 4, and the CD uniformity becomes poor as shown in FIG. 5.

It is understood from the above fact that the CD linearity and the CD uniformity become satisfactory when using a resist film having a thickness of about 280 nm to about 350 nm. A pattern of the chromium film 20 is shown in FIG. 9A as a comparison with a pattern (photomask) of the chromium film 2 in FIG. 7. When forming the pattern shown in FIG. 9A, a resist film with a thickness of about 500 nm and a chromium film with a thickness of about 110 nm are used, the light exposure amount is set to be 3.30 (1.65×2) $\mu C/cm^2$, and wet etching is used.

As described above, a resist film pattern with high sensitivity and high resolution can be obtained by making a resist film thinner. In particular, the CD linearity of 1 $\mu m$ or less becomes possible with the combination of a chromium film having a thickness of about 60 nm and a resist film having a thickness of about 280 nm to about 350 nm. A thin resist film having a thickness of about 280 nm to about 350 nm has high sensitivity, so that the exposure amount for correction is allowed to be increased sufficiently.

Furthermore, by prescribing the thickness of a light-blocking film (chromium film) to be 60 nm to 70 nm, an etching time can be shortened and the decrease in the thickness of the resist film during dry etching can be minimized while maintaining the transmittance of the chromium film at 0.5% or less which does not cause rapid optical changes.

Furthermore, the use of dry etching for a light-blocking film reduces edge roughness. By prescribing the thickness of a chromium film smaller than a conventional example, the chromium film is prevented from being tapered and a chromium film pattern becomes satisfactory. When a resist film is thin, each corner of the chromium film pattern is not likely to be round. Therefore, a satisfactory pattern configuration is obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a photomask, comprising the steps of:

forming a light-blocking film on a surface of a transparent substrate;

forming a resist film for an EB on the light-blocking film on a side thereof remote from the substrate;

patterning the resist film by EB writing and development; and selectively etching the light-blocking film using the patterned resist film as a mask to form a photomask;

wherein the light-blocking film has a thickness in the range of about 60 nm to about 70 nm.

2. A method for producing a photomask according to claim 1, wherein the resist film has a thickness in the range of about 280 nm to about 350 nm.

3. A method for producing a photomask according to claim 2, wherein the step of selectively etching the light-blocking film is performed by dry etching.

4. A method for producing a photomask according to claim 3, wherein the light-blocking film contains chromium.

5. A method for producing a photomask according to claim 1, wherein the light-blocking film contains chromium.

6. A method for producing a photomask according to claim 1, wherein an exposure amount of an EB used in the EB writing is in the range of about 2.3 $\mu C/cm^2$ to about 2.6 $\mu C/cm^2$.

7. A method for producing a photomask according to claim 1, wherein the step of selectively etching the light-blocking film is performed by dry etching.

* * * * *